United States Patent [19]

Dimmick

[11] 4,147,977
[45] Apr. 3, 1979

[54] MOTION ANALYZING SYSTEM

[75] Inventor: Paul R. Dimmick, Los Angeles, Calif.

[73] Assignee: Polaris N.V., Inc., Newport Beach, Calif.

[21] Appl. No.: 824,262

[22] Filed: Aug. 15, 1977

[51] Int. Cl.² .................. G01R 13/20; G01R 31/02; G02B 5/14
[52] U.S. Cl. .................. 324/121 R; 250/227; 250/231 R; 324/28 R
[58] Field of Search .................. 324/121, 96, 28 R; 350/96.24, 96.26; 250/227, 231 R

[56] References Cited

U.S. PATENT DOCUMENTS

| | | | |
|---|---|---|---|
| 2,067,262 | 1/1937 | Demontvignier et al. | 324/121 |
| 3,937,558 | 2/1976 | Mukai et al. | 350/96.24 |

*Primary Examiner*—Rudolph V. Rolinec
*Assistant Examiner*—Ernest F. Karlsen
*Attorney, Agent, or Firm*—Poms, Smith, Lande, Glenny & Rose

[57] ABSTRACT

The motion of an electromechanical device such as a relay may be analyzed through the use of the present system. A bundle of fiber optic filaments are located with one end adjacent the movable object which is to be sensed or analyzed. This movable object may, for example, be the armature of an electromagnet. With regard to the fiber optic probe, half of the fiber optic elements may be provided with input illumination and the other half of the bundle may be connected to transmit reflected light from the moving armature to a remotely located light-sensitive element such as an opto-transistor. An oscilloscope is provided to monitor the response of the electromagnet to applied signals. An actuating circuit is connected not only to apply energizing current to the electromagnet, but also to trigger the sweep of the oscilloscope. The vertical deflection plates of the oscilloscope are coupled to the output from the opto-transistor so that, as the armature of the relay is closed, more light is reflected back through the light pipes to the opto-transistor and the oscilloscope trace position will accurately reflect the movement of the relay armature.

6 Claims, 7 Drawing Figures

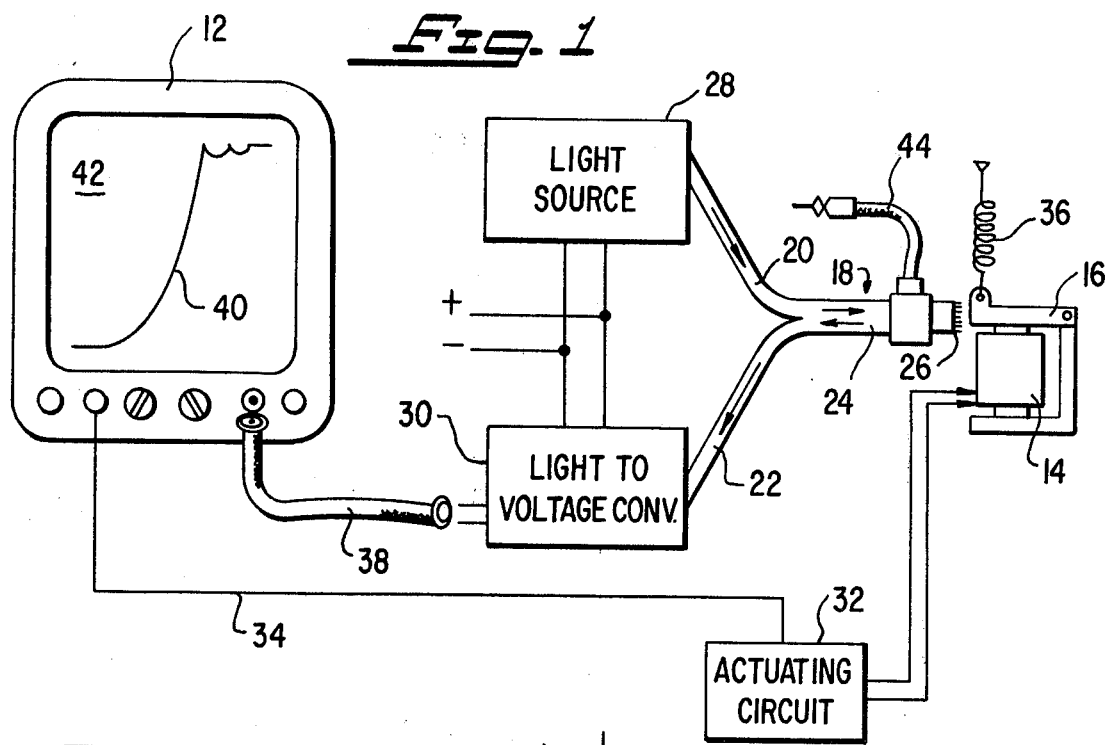
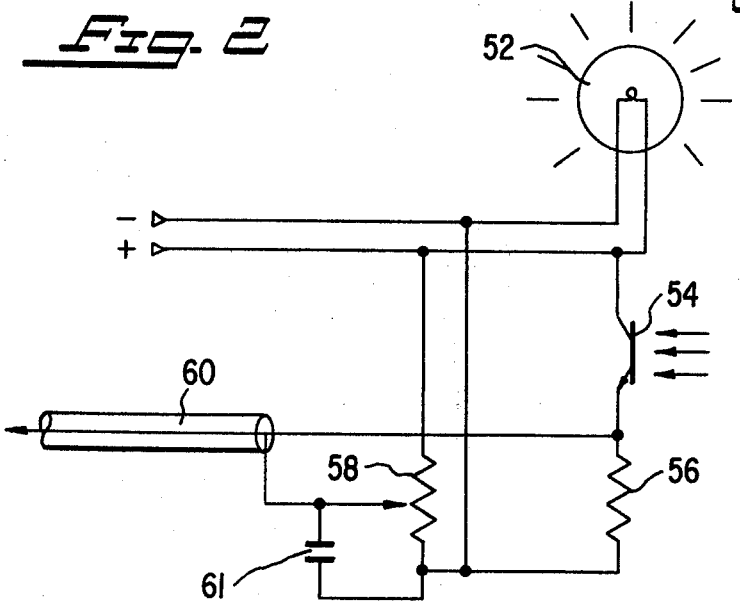
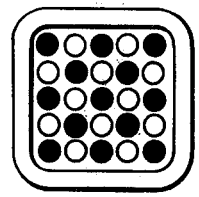
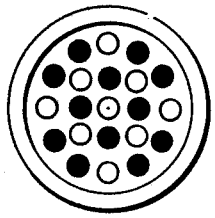
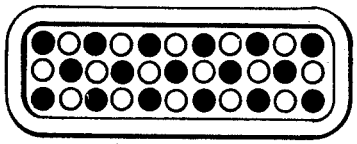

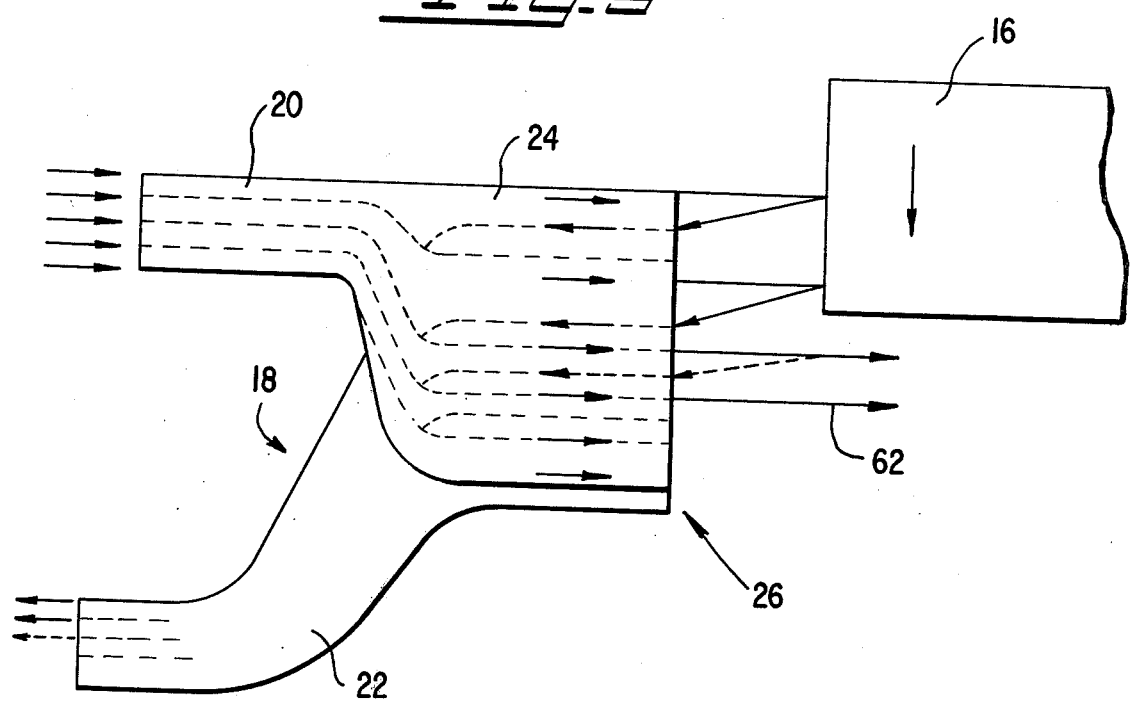
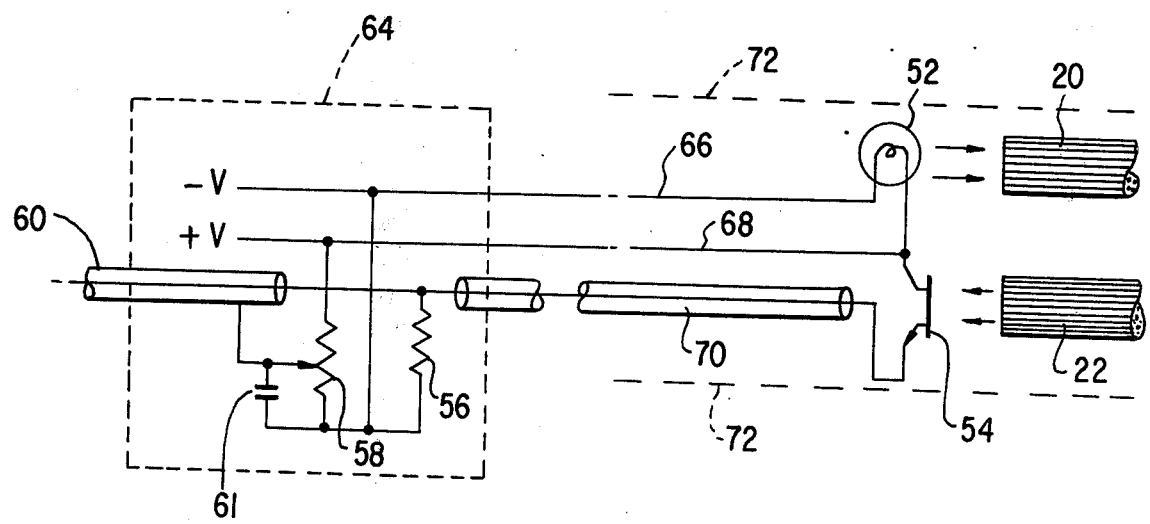

MOTION ANALYZING SYSTEM

FIELD OF THE INVENTION

This invention relates to diagnostic testing apparatus for electromechanical systems.

BACKGROUND OF THE INVENTION

In the production of electromechanical devices, and in particular to that relating to the computer peripheral and numeric control process equipment fields, electrical signals must be converted to mechanical motion. Since the resultant motion, in its relationship to the exciting signal, is affected by many variables, such as friction, mechanical tolerances, spring tensions, load variations, etc., most devices provide a means to adjust either electrically or mechanically to compensate for these variations. The objective of such adjustments is to ensure that the motion occurs at the proper time in relation to other operations of the system, and to maximize the useful life of the equipment prior to the time when degradations of the system due to wear and other physical changes will cause operational failure.

It would be desirable to view the results of these adjustments during dynamic operation of the system, and there are some methods available. The stroboscope can provide a direct view of the operation, but lacks an efficient method of relating the motion to time or electrical signals. In systems where the displacement is very small, it would be difficult for the viewer to determine mechanical relationships, without some other optical method to magnify this motion. Relative distance measurements would be difficult to obtain using this type of equipment. Built-in devices such as tachometers, load cells, accelerometers, optical sensors, etc., can provide this desired capability in some cases, but due to size and cost restrictions, are limited in application.

It would be desirable to have a method of measuring relative distances during the dynamic operation of the device.

Another desired capability is the versatility to observe the results of the mechanical motion at various positions along the train of motion.

To make these objectives available to the various people who could use them, the device which provides these capabilities should be of a size and construction to be easily transported and installed for use. The skill to use the device should be within the normal talents of production and field service personnel.

The principal objects of the present invention are the satisfaction or fulfillment of the foregoing objectives.

BRIEF SUMMARY OF THE INVENTION

A specific form of the invention involves a testing apparatus for electromechanical equipment such as relays and the like. An oscilloscope is employed, and an actuating circuit concurrently energizes both the electromagnetic device and also initiates the sweep circuit of the oscilloscope. The movement of the electromechanical device, such as the armature of an electromagnet, is sensed by a fiber optic probe. This fiber optic probe includes two interspersed sets of optical fibers, with one of the sets of fibers being employed to transmit light through the probe toward the path of the moving electromechanical element, and the other set of optical fibers being employed to route reflected illumination to a linear photo transistor. The output from the photo-transistor is applied to the deflection circuits of the oscilloscope so that the movement of the electromechanical device is displayed on the oscilloscope screen.

The probe constitutes a simple and inexpensive adjunct which permits the use of an oscilloscope to perform electromechanical testing functions which would otherwise require elaborate and expensive equipment.

In accordance with a broad aspect of the invention, an oscilloscope testing circuit includes an actuating circuit for both energizing the electromechanical device to be tested and also initiating the oscilloscope's sweep, a light source, a photoelectric transducer for detecting movement of the electromechanical device, and circuitry for applying a signal representing the reflected light to the deflection circuitry of the oscilloscope, to visually display the movement of the electromechanical device as a function of time.

In accordance with additional subordinate aspects of the invention, the light source and the photo transistor may be embedded in the probe, and a coaxial lead may extend from the photo transistor to the oscilloscope, or to an intermediate amplifier, or level control circuit.

Other objects, features, and advantages of the invention will become apparent from a consideration of the following detailed description and from the accompanying drawings.

BRIEF DESCRIPTION OF THE DRAWINGS

FIG. 1 shows a testing circuit illustrating the principles of the present invention;

FIG. 2 is a circuit diagram showing the circuitry for energizing the lamp and the photo transistor;

FIG. 3 is a diagram illustrating the principles of operation of the fiber optic probe which may be employed in the implementation of the present invention;

FIGS. 4, 5, and 6 show various aperture configurations for the sensing end of the fiber optic probe; and FIG. 7 is a circuit diagram alternative to the showing of FIG. 2.

DETAILED DESCRIPTION

Referring more particularly to the drawings, FIG. 1 shows an oscilloscope 12, and an electromagnet 14 having a movable armature 16, the response of which is to be analyzed. A fiber optic probe 18 is made up of two sets of optical fibers 20 and 22 which are interspersed in the section 24 of the fiber optic probe, which has its aperture 26 immediately adjacent the end of the movable armature 16 of electromagnetic 14. Light is transmitted from the light source 28 through the fiber optic probe 18 and is applied from aperture 26 toward the path movement of armature 16. Reflected light passes back through the light probe 18 through the set of optical fibers 22 to the photo-transistor 30.

In operation, the solenoid or electromagnet 14 is energized by the actuating circuit 32 which also sends a sweep trigger pulse to oscilloscope 12 over lead 34. Following energization by the actuating circuit 32, the armature 16 moves downwardly against the force of the biasing spring 36, and progressively reflects more light back toward the aperture 26 of fiber optic probe 18. The photo-transistor 30 amplifies this changing illumination signal transmitted over the fiber optic set 22 and applies the resultant electric signal over coaxial lead 38 to deflection circuitry included in oscilloscope 12.

A typical electromagnetic response characteristic 40 is shown on screen 42 of oscilloscope 12. The trace 40 shows an initial period of no movement of armature 16 followed by rapid movement, and finally terminating in certain minor oscillations indicating bouncing of the armature as it engages the electromagnet core or its stop. The fiber optic probe 18 may be provided with a flexible clamp 44 to facilitate locating the aperture 26 adjacent the electromagnetic element to be anaylzed.

FIG. 2 shows the direct current energizing circuit for the lamp 52 and the photo transistor 54. It also includes the load resistor 56 and a variable resistance 58 to establish the level of voltage applied over coaxial line 60 to the oscilloscope. Capacitor 61 serves to bypass high frequency noise pick-up to ground.

FIG. 3 is a simplified diagram showing the mode of operation of a fiber optic probe 18. More specifically, input light on the optical fibers 20 is transmitted from the entire face of the aperture 26, and light reflected from the end of armature 16 is transmitted back through the aperture 26 to the set of optical fibers 22 and back to the photodiode or opto-transistor. Arrow 62 indicates the transmission of light past the end of armature 16 in the case where the armature has not yet been fully closed.

FIGS. 4, 5, and 6 show alternative aperture configurations for the aperture 26 which has been discussed hereinabove. In FIGS. 4, 5, and 6 the two sets of optical fibers are identified by solid circles and by open circles, with the solid circles representing fibers from set 22 as shown in FIGS. 1 and 3, for example.

It is often desirable to have the probe 24 be of relatively small dimensions and to extend to remote locations. Such flexibility may be facilitated through the use of a very small bulb 52 and a small photodiode or opto-transistor 54 and by locating the remaining elements as shown in FIG. 2, for example, several feet away from the bulb 52 and the opto-transistor 54. Such an arrangement is shown in FIG. 7, with the dashed line block 64 being located several feet from the bulb 52 and the photodiode 54.

Incidentally, either a photodiode or an opto-transistor may be employed as photo-sensitive semiconductor element 54. The opto-transistor is to be preferred because it would give greater signal variations for a given change in illumination.

The leads 66 and 68, as well as the coaxial cable 70 interconnect the component box 64 with its level control resistor 58, to the lamp and photodiode combination. The direct current, preferably at a relatively low voltage such as five volts, is supplied to the photodiode, or opto-transistor 54 and miniature lamp 52 in parallel. With this arrangement, the maximum diameter of the probe, indicated by dashed lines 72 and its connections, including the lamp and the photodiode, is less than ⅜ of an inch, so that an inexpensive probe may be threaded to relatively inaccessible points for the analysis of electromechanical mechanisms.

What is claimed is:

1. A system for analyzing the translational motion of an electromechanical device comprising:
    an oscilloscope;
    actuating circuit means for energizing the electromechanical device to initiate mechanical movement thereof, and for initiating sweep circuitry in the oscilloscope;
    a fiber optic probe having first and second sets of light transmitting fibers which are interleaved at the aperture end of said probe and are separated at the other end of said probe;
    means for mounting the aperture end of said probe adjacent to and facing transverse to the path of movement of said device;
    light source means for applying light to said first set of light transmitting fibers to direct light toward the path of movement of said electromechanical device for selective reflection back toward and progressivly across the aperture end of said probe when said electromechanical device moves into the path of the light;
    substantially linear light sensing means for receiving light reflected back through said second set of light transmitting fibers and for providing an output voltage indicating the position of the electromechanical device in terms of the light reflected back to the aperture; and
    means for applying said output voltage to the oscilloscope deflection circuits to display the position of said electromechanical device as a function of time after energization of the electromechanical device.

2. A system as defined in claim 1 wherein said light source is a miniature light source, said light sensing means is a photo-sensitive semiconductor element and a relatively short fiber optic probe is employed, and further comprising:
    a level controlling variable resistor and capacitive means for by-passing high frequency pick-up to ground; and
    elongated connecting means for (1) interconnecting said variable resistor and said capacitor with said photo-sensitive element and miniature light source, (2) supplying direct current in parallel to said light source and said diode and (3) enclosing said photo-sensitive element and light source, whereby an inexpensive probe is provided which can be readily threaded into inaccessible locations to monitor remote electromechanical mechanisms.

3. A system for analyzing the motion of an electromechanical device comprising:
    means for plotting a trace of an electric signal versus time;
    actuating circuit means for energizing the electromechanical device and for initiating the operation of said trace plotting means;
    optical means for transmitting light to an aperture and for receiving light from an aperture;
    light source means for applying light to said optical means to direct light from said aperture toward the path of movement of said electromechanical device for selective reflection back toward said aperture when said electromechanical device moves into the path of the light;
    substantially linear light sensing means for receiving light reflected back to said aperture and for providing an output voltage indicating the position of the electromechanical device in terms of the light reflected back to said aperture;
    means for applying said output voltage to said trace plotting means to display the position of said electromechanical device as a function of time after energization of the electromechanical device; and
    said optical means including a fiber optic array having an elongated generally rectangular aperture.

4. A system as defined in claim 3 wherein said light sensing means is an opto-transistor.

5. A system as defined in claim 4 wherein said trace plotting means is an oscilloscope and wherein a coaxial line connects the output from said opto-transistor to said oscilloscope.

6. A system as defined in claim 3 wherein said light source means is a miniature light bulb, said light sensing means is a photo-sensitive semiconductor element, and further comprising an elongated probe encasing said light bulb, said photo-sensitive element and said fiber-optic element, whereby an inexpensive probe is provided for analyzing inaccessible mechanical mechanisms.

* * * * *